March 25, 1969 K. G. LITTLE, JR 3,435,367

DIGITALLY CONTROLLED FREQUENCY SYNTHESIZER

Filed Aug. 24, 1967

| KH | $N_1=50$, $N_2=45$, $N_3=45$ | $N_1=51$, $N_2=45$, $N_3=45$ | $N_1=58$, $N_2=54$, $N_3=54$ | $N_1=59$, $N_2=54$, $N_3=54$ |
|---|---|---|---|---|
| $f_1$ | 1,000 | 1,000 | 1,000 | 1,000 |
| $f_1/10$ | 100 | 100 | 100 | 100 |
| $N_1 f_1/10$ | 5,000 | 5,100 | 5,800 | 5,900 |
| $f_1\left(\frac{N_1}{100}+\frac{N_2}{10}\right)$ | 5,000 | 5,010 | 5,980 | 5,990 |
| $f_0$ | 5,000 | 5,001 | 5,998 | 5,999 |

KNOWLES G. LITTLE, JR.
INVENTOR

BY Bruce C. Lamb

ATTORNEY

United States Patent Office 3,435,367
Patented Mar. 25, 1969

3,435,367
DIGITALLY CONTROLLED FREQUENCY SYNTHESIZER

Knowles G. Little, Jr., Baltimore, Md., assignor to The Bendix Corporation, Baltimore, Md., a corporation of Delaware Filed Aug. 24, 1967, Ser. No. 662,992
Int. Cl. H03b *3/06*
U.S. Cl. 331—2 11 Claims

ABSTRACT OF THE DISCLOSURE

A frequency synthesizer for generating coherent frequencies using a plurality of serially cascaded stages. Each stage includes a digitally controlled phase locked loop utilizing a frequency generation by analysis system, with the output of a preceding loop being connected to the input of a succeeding loop sucessively through a variable frequency divider, a mixer and a fixed frequency divider. Reference frequencies are applied to the input of the first loop and to the various mixers.

*Background of the invention*

The basic phase locked digital synthesizer using a variable frequency counter or divider, phase detector and variable frequency oscillator to generate frequencies is well known. Briefly, this type of frequency synthesizer utilizes the variable frequency oscillator to generate the desired output frequency in response to the phase detector output signal. The output frequency is fed back through a variable freqency divider to the phase detector where it is compared with a scaling frequency which is supplied by a stable frequency reference. The output frequency is therefore equal to the reference scaling frequency times the count of the divider. The desired frequency may be varied by varying the count of the divider. In a digital system the divider will include a number of binaries so that the divider count will always be a whole number. It can thus be understood that only a single output frequency can be generated at any one time and the possible frequencies which can be generated will be separated by an amount equal to the scaling frequency. Theoretically such a system can be made to cover an arbitrary range or frequency band with any desired resolution and number of steps by decreasing the frequency of the reference and increasing the number of steps through which the divider may be varied. The reference scaling frequency of such a system is related to the range and number of steps or channels by the basic relationship, $f_1=F/C$, where $f_1$=reference scaling frequency, F=total frequency range and C=number of channels. From this we see that as the number of channels (output frequencies) increases in a given frequency range the reference scaling frequency decreases proportionately. Additionally as the number of channels in a given frequency range increases, thereby decreasing the reference scaling frequency, the number of times in a given time period that the phase detector will compare the output frequency with the reference scaling frequency decreases. A simple example will serve to illustrate this dilemma. Assume that in a single phase locked loop synthesizer a range of frequencies from 5,000 to 6,000 kHz. is desired on 11 equally spaced channels. This means a channel spacing and hence, reference frequency of 100 kHz. is required. Applying these figures to the aforementioned basic relationship it is seen that N must vary from N=50 when the output frequency is 5,000 kHz. to N=60 when the output frequency is 6,000 kHz. The output frequency, under these conditions, will be sampled at a rate of 100,000 times per second. Assume, now, that over the same frequency range, i.e., 5,000 to 6,000 kHz., 1001 equally spaced channels are desired. This means that a channel spacing, and hence reference frequency of 1 kHz. is required. Again applying these figures to the aforementioned basic relationship it is seen that N must now vary from N=5,000 when the output frequency is 5,000 kHz. to N=6,000 when the output frequency is 6,000 kHz. The output frequency, under these new conditions, will be sampled only at a rate of 1,000 times per second. In other words, the output under these conditions will go through 5,000 complete cycles between samplings, while under the previous conditions the output will go through only 50 complete cycles between samplings. Since in any practical system the output frequency is subjected to various disturbing influences, spectral purity of the outpt is increasingly impaired as the ratio of reference scaling frequency to output frequency decreases.

In the basic phase locked loop frequency synthesizer the count of the divider must be capable of being varied over the same number of contiguous steps as the number of contiguous channels desired. As the number of channels becomes excessive, the number of steps to which the divider must be varied also becomes excessive.

Frequency synthesizers have become commercially available which eliminate the aforementioned disadvantage by cascading a number of stages, each stage performing essentially an identical operation on a carrier frequency. Briefly, each stage of these commercially available systems would consist of a first mixer for combining the carrier frequency with a first fixed reference frequency, a second mixer for combining the output frequency of the first mixer with one frequency selected from a group of reference frequencies, and phase locked loop for dividing the output of the second mixer by ten. The selectable frequency for combining in the second mixer might typically be one of ten generated frequencies suitably chosen by the system designer to allow the operator to select frequencies at convenient intervals. Usually the selected frequency is available from a group of ten frequencies equally spaced, thereby affording the operator decimal control over the output frequency. Where a number of such stages are cascaded, the frequency chosen in each stage is correlative to a significant digit of the output frequency. In this type of frequency synthesizer carrier frequencies, first reference frequencies, and second reference frequencies must be available. Additionally, multiple mixers are required in each stage. Since mixers generate many spurious products the output of each mixer must be carefully filtered. The phase locked loop which performs a divide by ten operation of the carrier frequency must of necessity include a times ten operation on the output frequency before feeding the output frequency back into the phase locked loop phase detector.

With the increasingly economical availability of digital circuitry a more completely digital approach to frequency synthesis has become advantageous.

*Summary of the invention*

Accordingly, a digitally controlled frequency synthesizer has been devised wherein a plurality of serially cascaded stages, each stage including a phase locked loop, are utilized to generate a desired coherent output frequency. A signal in the form of a frequency generated by a preceding phase locked loop is successively divided in a variable frequency divider by $N_0$, mixed with a reference frequency, and divided by ten in a fixed frequency divider before being applied to the succeeding phase locked loop, which essentially performs a times $N_0$ operation upon the signal. The $N_0$ functions in a given stage are ganged together and made selectively variable over the desired range.

*Description of the preferred embodiment*

Figures 1, 2:
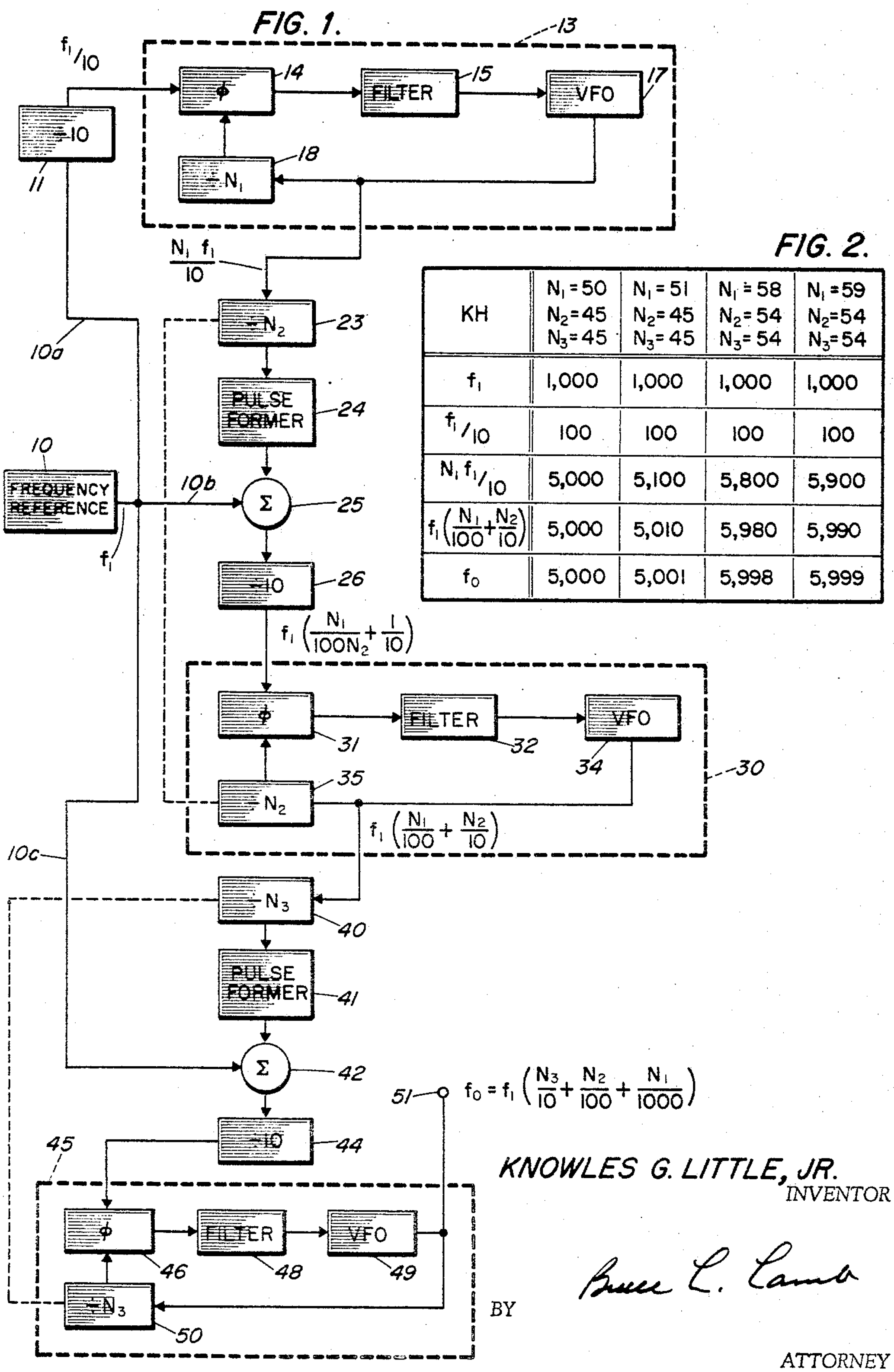
FIG. 1 is a block diagram of a three stage frequency synthesizer made in accordance with this invention.
FIG. 2 is a table of frequencies at specified points in the frequency synthesizer of FIG. 1 for various values of $N_1$, $N_2$, and $N_3$.

Referring to FIG. 1, a stable frequency reference 10, suitably a crystal controlled oscillator, generates a reference frequency $f_1$ which is supplied to a divide-by-ten frequency divider 11 through line 10*a*. Divider 11 typically comprises a cascade of binaries or flip-flops connected in such a way as to generate an approximate square wave in response to $f_1$ at a frequency of $f_1/10$. Although the output of divider 11 is not a sinusoidal waveform, but a square wave of one-tenth the frequency of $f_1$, the expression $f_1/10$ will be used to represent this square wave and the time and phase relationship between itself and $f_1$. In like manner, in various other parts of this description the term containing $f_1$ will be used either to indicate a sinusoidal waveform or a series of pulses or voltage transitions which are representative of the stated time and phase relationship to reference frequency $f_1$. Generally, whether the expression used indicates pulses or sinusoidal waveforms will be clear from the description.

The output of divider 11 which is a scaling frequency is supplied to phase detector 14 of digitally controlled phase locked loop 13 which includes, in addition to phase detector 14, filter 15, variable frequency oscillator 17, and divide-by-$N_1$ variable frequency divider 18. Variable frequency oscillator 17 is suitably a voltage controlled oscillator having varactor diodes in a tank circuit which vary in response to an error voltage generated by a phase detector to control the oscillator output frequency. Other types of variable frequency oscillators can be used where their output frequency range is acceptable and their method of control is compatible with the controlling phase detector error signal. In this embodiment, oscillator 17 generates a sinusoidal frequency which is $N_1$ times the input frequency because of the before mentioned operation of a basic phase locked loop, that is, the frequency generated by oscillator 17 is divided by $N_1$ in frequency divider 18 which is similar to divider 11, except that $N_1$ is selectable. Frequency output of divider 18 is compared with the frequency output of divider 11 in phase detector 14.

Various types of phase detectors are well known in the art. The phase detector used in any system must generate an error signal correlative to the phase difference of signals being compared; the generated error signal being suitable for use or adaptable for use by the variable frequency oscillator so as to control the oscillator frequency. The phase detector found to be particularly adaptable to the synthesizer being described is the diode ring demodulator. Briefly, this phase detector utilizes a closed ring of four serially connected diodes having diametrically opposed terminals between diodes connected across the secondary of an input transformer and the orthogonal terminals of the ring connected across the secondary winding of a second input transformer. The two signals whose phase difference is to be compared are applied to the detector: one signal being applied across the primary of one input transformer and the other signal being applied across the primary of the second input transformer. The detector output is taken across center-tap terminals of the input transformer secondaries. This type of phase detector is essentially a full wave rectifier type wherein the rectified output of one input signal is referenced to the rectified output of the other input signal so that the phase detector produces a D.C. voltage which is correlative to the phase difference between the two input frequencies. It should now be obvious that when the two signals applied to the phase detector are exactly the same frequency and synchronized, the error signal is zero, the loop is locked, and the voltage controlled oscillator frequency is $N_1f_1/10$.

When the loop is not locked, an error signal is generated which urges the oscillator to change frequency toward the locked condition.

The output frequency of loop 13 is applied to divide-by-$N_2$ frequency divider 23 whose output since the divider, as has been discussed, comprises a cascade of binaries will be an approximate square wave of frequency $$N_1f_1/10N_2$$

This square wave is shaped and limited in pulse former 24 before being combined in mixer 25 with reference frequency $f_1$ supplied from stable frequency reference 10 over line 10*b*. A suitable filter passes only the heterodyned frequency sum so that mixer 25 output is $$f_1\left(\frac{N_1}{10N_2}+1\right)$$

which is applied to divide-by-ten frequency divider 26 which is similar to divider 11. The output of divider 26 is $$f_1\left(\frac{N_1}{100N_2}+\frac{1}{10}\right)$$

This last mentioned signal constitutes a scaling frequency which is applied to phase detector 31 of phase locked loop 30, which is identical to phase locked loop 13 except that divide-by-$N_2$ divider 35 is ganged to divider 23 so as to be of identical count as divider 23. The output frequency of loop 30 is therefore its input multiplied by $N_2$ or $$f_1\left(\frac{N_1}{100}+\frac{N_2}{10}\right)$$

In a manner similar to that described above, the output frequency of loop 30 is applied to divide-by-$N_3$ divider 40 and then through pulse former 41 to mixer 42, where it is heterodyned with $f_1$ and filtered to produce $$f_1\left(\frac{N_1}{1000N_3}+\frac{N_2}{100N_3}+\frac{1}{10}\right)$$

This last signal which is also a scaling frequency is applied to phase locked loop 45, which is generally identical to the aforementioned phase locked loops except that loop divider 50 is ganged to divider 40 so as to be of identical count with divider 40. Loop output frequency appearing at terminal 51 is therefore $$f_0=f_1\left(\frac{N_3}{10}+\frac{N_2}{100}+\frac{N_1}{1000}\right)$$

It is thus seen that judicious choice of frequency dividers 11, 26 and 44 has produced an output frequency which is decimally related to the reference frequency. If $N_1$, $N_2$ and $N_3$ are now chosen to cover a range of 10 integers, a completely decimal system will result. Different values of division might be used to advantage such as where, for example, other than a decimal relationship between reference and final frequencies is desired.

The synthesizer shown might be properly described as a cascaded, three stage digitally controlled frequency synthesizer. The first stage consists of the simple phase locked loop 13. The second stage includes not only phase locked loop 30 but also counters 23 and 26, pulse former 24 and mixer 25. Subsequent stages are similar to the second stage.

$N_1$, $N_2$ and $N_3$ are each adjustable over a range of integral values such as $N_{1A}$ to $N_{1B}$
$N_{2A}$ to $N_{2B}$
$N_{3A}$ to $N_{3B}$ Examination of the mathematical representation for the synthesizer output frequency should disclose that the total number of synthesizer frequency channels available is $$(N_{1A}-N_{1B})(N_{2A}-N_{2B})(N_{3A}-N_{3B})$$

In the presently described synthesizer when $N_1$, $N_2$ and $N_3$ are adjustable over a range of ten values, there are 1000 channels available.

It should also be noted that a stage input signal is immediately acted upon by a variable frequency divider to divide the signal by some value of N. The reference frequency is then added and the total signal, that is, both the input signal divided by N and the reference frequency are divided by ten in the divide-by-ten divider. The total signal is then multiplied by N in the phase locked loop of the stage. In essence, therefore, the total signal is divided by ten, but only the reference signal added in the particular stage is multiplied by N. In a single stage synthesizer, where the output frequency is $N_1f_1$, $f_1$ being the reference frequency and $N_1$ the divider count, minimum channel spacing is $f_1$ since $N_1$ can only be an integer. In a cascaded, multistage synthesizer, where the reference frequency is the same for each stage, channel spacing is equal to the reference frequency divided by the total number of parts into which the reference frequency is divided. In the presently described synthesizer, the reference frequency is successively divided by ten in dividers 11, 26 and 44, therefore dividing the reference into 1000 parts. Channel spacing is therefore $$f_1/1000$$

FIG. 2 shows a typical range of values of frequency at various points in the synthesizer for a reference frequency of 1000 kHz. as $N_1$ is stepped from 50 to 59 ad $N_2$ and $N_3$ are stepped from 45 to 54. Channel spacing is seen to be $$f_1/1000=1 \text{ kHz.}$$

Range of the synthesizer is 5000 kHz. to 5999 kHz. or 1000 kHz. total range at 1 kHz. channel spacing for a total of 1000 channels.

Although I have described only one embodiment of my invention, it should be obvious to one skilled in the art that completely generalized synthesizer systems can be assembled using the principles of this invention wherein, for example, reference frequencies for the various stages can be different and divider values changed. I, therefore, do not wish to limit my invention to the specific form shown and accordingly hereby claim as my invention the subject matter including modifications and alterations thereof encompassed by the true scope and spirit of the appended claims.

The invention claimed is:

1. A multistage digitally controlled frequency synthesizer comprising:

- a first stage including a digitally controlled phase locked loop;
- a plurality of subsequent stages serially connected with said first stage and including in sequence a first variable digital frequency divider, a mixer, a fixed digital frequency divider, and a digitally controlled phase locked loop.

2. A digitally controlled frequency synthesizer as recited in claim 2 wherein each subsequent stage phase locked loop includes a variable digital frequency divider ganged to said first variable digital frequency divider.

3. A signal synthesizer comprising:

- a plurality of phase locked loops each loop including a loop frequency divider;
- means for serially connecting said loops whereby the output of a preceding loop is connected to the input of a succeeding loop through and in succession, a variable frequency divider, a mixer, and a fixed frequency divider;
- an input terminal connected to the input of the first of said serially connected loops;
- a source of reference signals;
- means for connecting said reference source to said input terminal;
- and means for connecting each said mixer to said reference source.

4. A frequency synthesizer as recited in claim 3 wherein said loop frequency divider is ganged to said variable frequency divider.

5. A frequency synthesizer as recited in claim 4 wherein said fixed frequency divider performs a divide by ten function;

- and said means for connecting said reference frequency to said input terminal includes a fixed digital frequency divider performing a divide by ten function.

6. A frequency synthesizer comprising:

- a plurality of digitally controlled phase locked loops;
- means for serially connecting said loops whereby the output of the preceding loop is connected to the input of a succeeding loop through and in succession, a variable digital frequency divider, a mixer, and a fixed digital frequency divider;
- an input terminal connected to the input of the first of said loops;
- a source of reference frequencies;
- means for connecting said reference source to said input terminal;
- and means for connecting each said mixer to said reference source.

7. A frequency synthesizer as recited in claim 6 wherein said means for connecting said reference source to said input terminal includes a digital frequency divider.

8. A frequency synthesizer as recited in claim 6 wherein said means for connecting said reference source to said input terminal includes a fixed digital frequency divider.

9. A frequency synthesizer as recited in claim 6 wherein the first of said phase locked loops receives a scaling frequency from said reference source and each subsequent said phase locked loop receives a scaling frequency from said fixed digital frequency divider and wherein each said loop includes:

- a variable frequency oscillator for generating a loop frequency in response to an error signal;
- a variable digital frequency divider for dividing said loop frequency; and
- a detector for generating said error signal in response to said scaling frequency and said divided loop frequency.

10. A frequency synthesizer as recited in claim 9, wherein said detector generates an error signal in response to the phase difference between said divided loop frequency and said scaling frequency.

11. A frequency synthesizer as recited in claim 10, wherein said detector comprises a diode ring demodulator.

References Cited

UNITED STATES PATENTS 3,319,178 5/1967 Broadhead ---------- 331—2

JOHN KOMINSKI, *Primary Examiner.*

U.S. Cl. X.R.

331—16, 26, 22